(12) United States Patent
Nishida

(10) Patent No.: US 9,300,308 B2
(45) Date of Patent: Mar. 29, 2016

(54) LIGHT EMITTING DEVICE AND ATOMIC OSCILLATOR

(71) Applicant: Seiko Epson Corporation, Tokyo (JP)

(72) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/514,823

(22) Filed: Oct. 15, 2014

(65) Prior Publication Data

US 2015/0102864 A1   Apr. 16, 2015

(30) Foreign Application Priority Data

Oct. 16, 2013   (JP) ................. 2013-215566

(51) Int. Cl.

| | |
|---|---|
| H03B 17/00 | (2006.01) |
| H03L 7/26 | (2006.01) |
| H01S 5/183 | (2006.01) |
| G04F 5/14 | (2006.01) |
| H01S 5/06 | (2006.01) |
| H01S 5/343 | (2006.01) |

(52) U.S. Cl.
CPC *H03L 7/26* (2013.01); *G04F 5/145* (2013.01); *H01S 5/18302* (2013.01); *H01S 5/18355* (2013.01); *H01S 5/18361* (2013.01); *H01S 5/18394* (2013.01); *H01S 5/0614* (2013.01); *H01S 5/18313* (2013.01); *H01S 5/18341* (2013.01); *H01S 5/18386* (2013.01); *H01S 5/34313* (2013.01); *H01S 2301/14* (2013.01); *H01S 2301/176* (2013.01)

(58) Field of Classification Search
CPC .................. H03B 17/26; H01S 3/08
USPC ............ 331/94.1, 3; 372/50.124, 46.01
See application file for complete search history.

(56) References Cited

U.S. PATENT DOCUMENTS

| | | | |
|---|---|---|---|
| 5,568,502 A | 10/1996 | Hironaka | |
| 6,134,251 A | 10/2000 | Kawase et al. | |
| 7,668,219 B2 | 2/2010 | Onishi | |

(Continued)

FOREIGN PATENT DOCUMENTS

| | | |
|---|---|---|
| EP | 1389813 A1 | 2/2004 |
| EP | 2407834 A1 | 1/2012 |

(Continued)

OTHER PUBLICATIONS

Extended European Search Report for Application No. EP 14 18 8778 dated Feb. 24, 2015 (6 pages).

*Primary Examiner* — Joseph Chang
(74) *Attorney, Agent, or Firm* — Harness, Dickey & Pierce, P.L.C.

(57) ABSTRACT

A light emitting device includes a first semiconductor multilayer film mirror of a first conductivity type, a second semiconductor multilayer film mirror of a second conductivity type that is different from the first conductivity type, an active layer formed between the first semiconductor multilayer film mirror and the second semiconductor multilayer film mirror, a third semiconductor multilayer film mirror of a semi-insulating type formed between the first semiconductor multilayer film mirror and the active layer, and a contact layer of the first conductivity type formed between the third semiconductor multilayer film mirror and the active layer, and the third semiconductor multilayer film mirror is formed of a material having a bandgap energy higher than an energy of light generated in the active layer.

10 Claims, 9 Drawing Sheets

(56) References Cited

U.S. PATENT DOCUMENTS

| | | |
|---|---|---|
| 7,974,327 B2 | 7/2011 | Ariga et al. |
| 8,253,503 B2 | 8/2012 | Aoyama et al. |
| 2005/0169343 A1 | 8/2005 | Ostermann et al. |

FOREIGN PATENT DOCUMENTS

| | | |
|---|---|---|
| JP | 60-032381 A | 2/1985 |
| JP | 03-011689 | 1/1991 |
| JP | 07-094827 A | 4/1995 |
| JP | 08-116139 A | 5/1996 |
| JP | 10-270799 A | 10/1998 |
| JP | 3482824 B2 | 1/2004 |
| JP | 2007-243121 A | 9/2007 |
| JP | 2008-028120 A | 2/2008 |
| JP | 2011-066111 A | 3/2011 |
| JP | 2011-159943 A | 8/2011 |
| JP | 2012-156541 A | 8/2012 |
| JP | 2013-021278 A | 1/2013 |
| WO | WO-2006-011370 A1 | 2/2006 |
| WO | WO-2007-105328 A1 | 9/2007 |
| WO | WO-2008-029283 A2 | 3/2008 |

LIGHT EMITTING DEVICE AND ATOMIC OSCILLATOR

BACKGROUND

1. Technical Field

The present invention relates to a light emitting device and an atomic oscillator.

2. Related Art

In recent years, an atomic oscillator using coherent population trapping (CPT) as a quantum interference effect has been proposed, and downsizing and reduction in power consumption of the device have been expected. The atomic oscillator using CPT uses an electromagnetically induced transparency phenomenon (EIT phenomenon) that absorption of coherent light beams respectively having two wavelengths (frequencies) that are different from each other stops if an alkali metal atom is irradiated with the resonance light beams.

The atomic oscillator can realize high accuracy by accurately controlling the difference (the frequency difference) between the two wavelengths described above. Therefore, it is preferable for a light emitting device (a light source) for emitting light beams respectively having the two wavelengths to have a variable wavelength mechanism for retrieving the wavelengths to predetermined values in the case in which the wavelengths of the light beams emitted from the light emitting device fluctuate due to the temperature of the light emitting device.

For example, JP-A-10-270799 describes a light emitting device provided with a wavelength conversion section for absorbing light emitted by a light emitting section, then converting the light thus absorbed into light with a wavelength based on the magnitude of an external electric field or the presence or absence of the external electric field, and then emitting the result.

However, in the light emitting device of JP-A-10-270799, since the wavelength of the light to be emitted is varied due to the absorption of the light in the wavelength conversion section, the variation in the wavelength is large, and it is difficult to vary the wavelength with a small variation. Therefore, the light emitting device of JP-A-10-270799 cannot control the wavelength with high accuracy, and cannot be used as a light source of the atomic oscillator.

SUMMARY

An advantage of some aspects of the invention is to provide a light emitting device capable of varying the wavelength with a small variation. Another advantage of some aspects of the invention is to provide an atomic oscillator including the light emitting device capable of varying the wavelength with a small variation.

A light emitting device according to an aspect of the invention includes a first semiconductor multilayer film mirror of a first conductivity type, a second semiconductor multilayer film mirror of a second conductivity type that is different from the first conductivity type, an active layer formed between the first semiconductor multilayer film mirror and the second semiconductor multilayer film mirror, a third semiconductor multilayer film mirror of a semi-insulating type formed between the first semiconductor multilayer film mirror and the active layer, a contact layer of the first conductivity type formed between the third semiconductor multilayer film mirror and the active layer, a first electrode electrically connected to the first semiconductor multilayer film mirror, a second electrode electrically connected to the second semiconductor multilayer film mirror, and a third electrode having ohmic contact with the contact layer, and the third semiconductor multilayer film mirror is formed of a material having a bandgap energy higher than an energy of light generated in the active layer.

According to such a light emitting device as described above, the absorption of the light generated in the active layer can be suppressed in the third semiconductor multilayer film mirror, and the wavelength (the oscillation wavelength) of the light generated in the active layer can be varied by varying the refractive index of the third semiconductor multilayer film mirror using the electrooptic effect. Therefore, the oscillation wavelength can be varied with a small variation compared to the case of varying the oscillation wavelength using the light absorption in the semi-insulating semiconductor layer. As a result, in the light emitting device, the wavelength can be controlled with high accuracy.

It should be noted that in the descriptions related to the invention, the term "electrically connected" is used in such a phrase as "a specific member (hereinafter referred to as a "member B") "electrically connected" to another specific member (hereinafter referred to as a "member A")." In the descriptions related to the invention, in such a case as this example, the term "electrically connected" is used in order to include the case in which the member A and the member B are electrically connected while having direct contact with each other, and the case in which the member A and the member B are electrically connected to each other via another member.

The light emitting device according to the aspect of the invention may be configured such that a voltage is applied between the first electrode and the third electrode by a first power supply, and a voltage is applied between the second electrode and the third electrode by a second power supply different from the first power supply.

According to such a light emitting device as described above, the voltages can be applied between the first electrode and the third electrode, and between the second electrode and the third electrode separately (independently) using the first power supply and the second power supply.

The light emitting device according to the aspect of the invention may be configured to include a polarization section (polarizer) adapted to polarize the light generated in the active layer.

According to such a light emitting device as described above, the variation in refractive index in the third semiconductor multilayer film mirror can be controlled using the polarization section.

The light emitting device according to the aspect of the invention may be configured such that the active layer and the second semiconductor multilayer film mirror constitute a columnar section, the polarization section includes a semiconductor layer configured integrally with the columnar section, and the polarization section provides the active layer with a distortion using the semiconductor layer.

According to such a light emitting device as described above, it is not necessary to increase the manufacturing process for forming the polarization section, and thus, the cost can be suppressed.

The light emitting device according to the aspect of the invention may be configured such that the polarization section projects in a first direction from the columnar section in a first direction viewed from a stacking direction of the first semiconductor multilayer film mirror and the active layer, and the first direction coincides with one of a long-axis direction and a short-axis direction of an index ellipsoid of the third semiconductor multilayer film mirror in a state in which a voltage is applied between the first electrode and the third electrode.

According to such a light emitting device as described above, it is possible to inhibit the refractive index variation due to the photoelastic effect and the refractive index variation due to the electrooptic effect in the third semiconductor multilayer film mirror from being canceled out with each other in the effective refractive index in the stacking direction of the first semiconductor multilayer film mirror and the active layer. As a result, it is possible to surely polarize the light generated in the active layer.

An atomic oscillator according to another aspect of the invention is adapted to cause an electromagnetically induced transparency phenomenon in an alkali metal atom using a resonant light pair, and includes a light emitting device adapted to generate the resonant light pair having two frequency components that are different from each other to irradiate the alkali metal atom with the resonant light pair, and a light detection section (detector) adapted to detect intensity of light transmitted through the alkali metal atom, wherein the light emitting device includes a first semiconductor multilayer film mirror of a first conductivity type, a second semiconductor multilayer film mirror of a second conductivity type that is different from the first conductivity type, an active layer formed between the first semiconductor multilayer film mirror and the second semiconductor multilayer film mirror, a third semiconductor multilayer film mirror of a semi-insulating type formed between the first semiconductor multilayer film mirror and the active layer, a contact layer of the first conductivity type formed between the first semiconductor multilayer film mirror and the third semiconductor multilayer film mirror, a first electrode electrically connected to the first semiconductor multilayer film mirror, a second electrode electrically connected to the second semiconductor multilayer film mirror, and a third electrode having ohmic contact with the contact layer, and electrically connected to the third semiconductor multilayer film mirror, and the third semiconductor multilayer film mirror is formed of a material having a bandgap energy higher than an energy of light generated in the active layer.

According to such an atomic oscillator as described above, the light emitting device capable of varying the wavelength by a small variation can be included. Therefore, in such an atomic oscillator, the center wavelength of the resonant light pair emitted from the light emitting device can be controlled with high accuracy.

The atomic oscillator according to the aspect of the invention may be configured to include a light output control section (controller) adapted to apply a voltage between the second electrode and the third electrode based on intensity of a detection signal output by the light detection section, to control light output of the light emitting device, and a center frequency control section (controller) adapted to apply a voltage between the first electrode and the third electrode based on the intensity of the detection signal output by the light detection section, to control a center frequency of the resonant light pair.

According to such an atomic oscillator as described above, since the center frequency can be controlled without injecting a current into the active layer of the light emitting device, it is possible to prevent the control from becoming complicated. In the case of, for example, injecting the current into the active layer to control the center frequency, since the light output also varies in accordance with the injection amount of the current, the control becomes complicated.

The atomic oscillator according to the aspect of the invention may be configured such that the light emitting device includes a polarization section adapted to polarize the light generated in the active layer.

According to such an atomic oscillator as described above, the variation in refractive index in the third semiconductor multilayer film mirror can be controlled using the polarization section.

The atomic oscillator according to the aspect of the invention may be configured such that the active layer and the second semiconductor multilayer film mirror constitute a columnar section, the polarization section includes a semiconductor layer configured integrally with the columnar section, and the polarization section provides the active layer with a distortion using the semiconductor layer.

According to such an atomic oscillator as described above, it is not necessary to increase the manufacturing process for forming the polarization section, and thus, the cost can be suppressed.

The atomic oscillator according to the aspect of the invention may be configured such that the polarization section projects in a first direction from the columnar section in a first direction viewed from a stacking direction of the first semiconductor multilayer film mirror and the active layer, and the first direction coincides with one of a long-axis direction and a short-axis direction of an index ellipsoid of the third semiconductor multilayer film mirror in a state in which a voltage is applied between the first electrode and the third electrode.

According to such an atomic oscillator as described above, it is possible to inhibit the refractive index variation due to the photoelastic effect and the refractive index variation due to the electrooptic effect in the third semiconductor multilayer film mirror from being canceled out with each other in the effective refractive index in the stacking direction of the first semiconductor multilayer film mirror and the active layer. As a result, it is possible to more surely polarize the light generated in the active layer.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, some preferred embodiments of the invention will be explained in detail with reference to the accompanying drawings. It should be noted that the embodiments described below do not limit the contents of the invention as set forth in the appended claims. Further, all of the constituents explained hereinafter are not necessarily essential elements of the invention.

1. First Embodiment 1.1. Light Emitting Device

Figure 1:
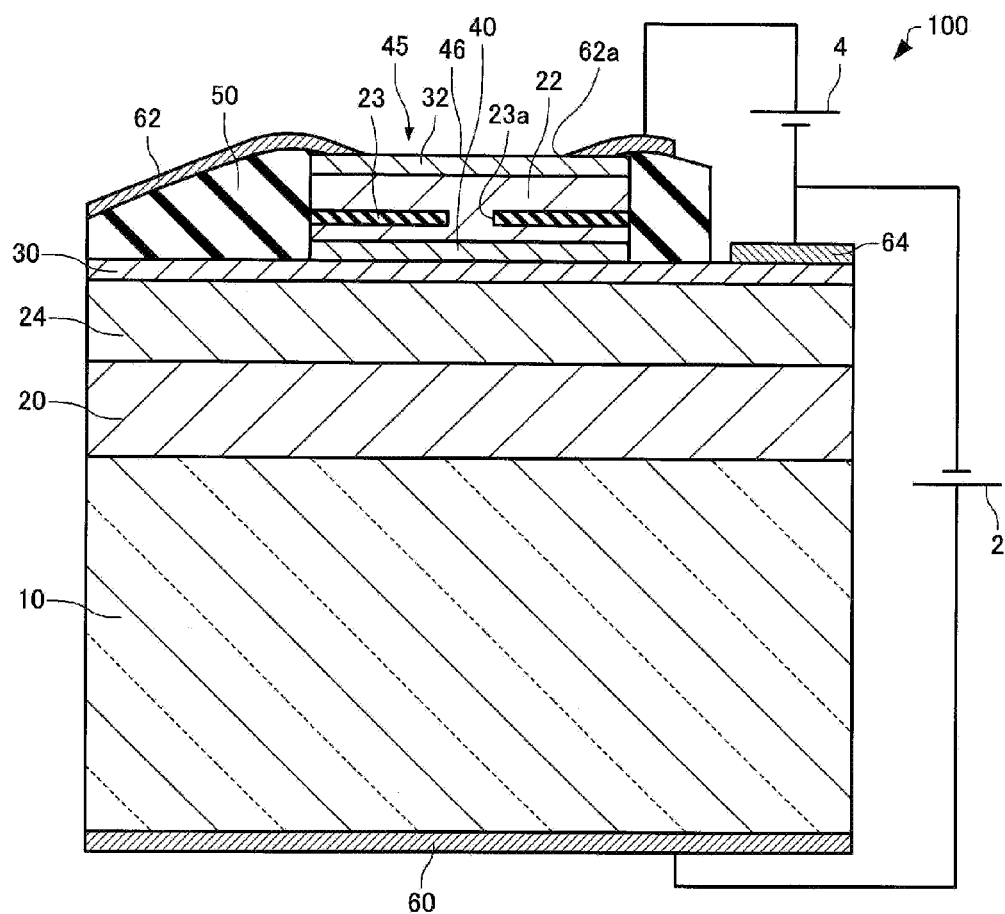
FIG. 1 is a cross-sectional view schematically showing a light emitting device according to a first embodiment of the invention.
Figure 2:
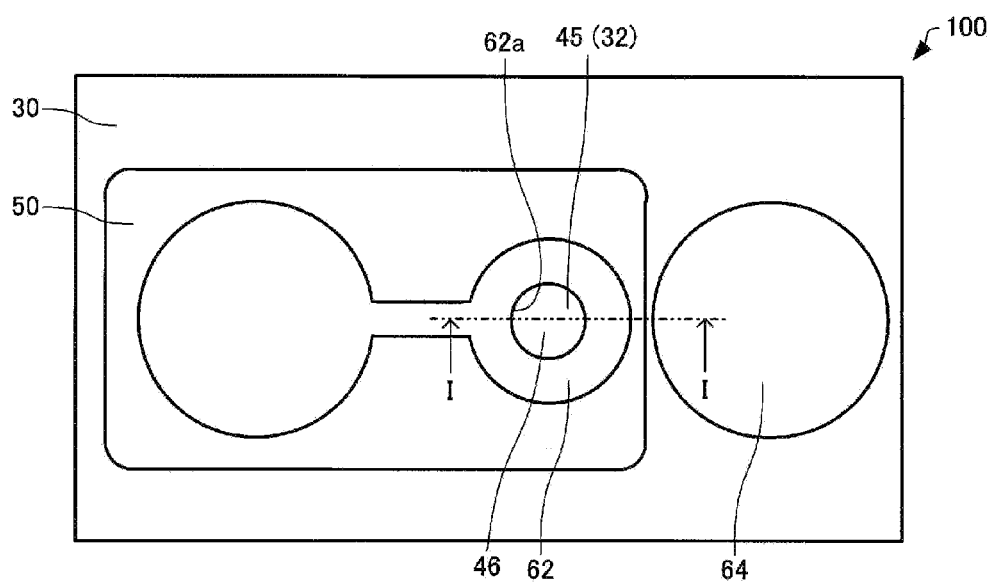
FIG. 2 is a plan view schematically showing the light emitting device according to the first embodiment.

Firstly, a light emitting device according to a first embodiment will be explained with reference to the accompanying drawings. FIG. 1 is a cross-sectional view schematically showing the light emitting device 100 according to the first embodiment. FIG. 2 is a plan view schematically showing the light emitting device 100 according to the first embodiment. It should be noted that FIG. 1 is a cross-sectional view along the I-I line shown in FIG. 2.

As shown in FIGS. 1 and 2, the light emitting device 100 includes a substrate 10, a first semiconductor multilayer mirror 20, a second semiconductor multilayer film mirror 22, a third semiconductor multilayer film mirror 24, a first contact layer 30, a second contact layer 32, an active layer 40, an insulating layer 50, a first electrode 60, a second electrode 62, and a third electrode 64. The light emitting device 100 is a surface emitting semiconductor laser (Vertical Cavity Surface Emitting Laser (VCSEL)).

The substrate 10 is, for example, a first conductivity type (e.g., an n-type) GaAs substrate.

The first semiconductor multilayer film mirror 20 is formed on the substrate 10. The first semiconductor multilayer film mirror 20 is a semiconductor layer of a first conductivity type. The first semiconductor multilayer film mirror 20 is a distributed Bragg reflector (DBR) mirror having high-refractive index layers (not shown) and low-refractive index layers (not shown) alternately stacked on each other. The high-refractive index layers are each, for example, an n-type $Al_{0.15}Ga_{0.85}As$ layer doped with silicon. The low-refractive index layers are each, for example, an n-type $Al_{0.9}Ga_{0.1}As$ layer doped with silicon. The number of the high-refractive index layers and the low-refractive index layers stacked on each other (the number of pairs thereof) is preferably no smaller than 3 pairs and no larger than 40 pairs.

The third semiconductor multilayer film mirror 24 is formed on the first semiconductor multilayer film mirror 20. The third semiconductor multilayer film mirror 24 is formed between the first semiconductor multilayer film mirror 20 and the active layer 40. In the example shown in the drawings, the third semiconductor multilayer film mirror 24 is formed between the first semiconductor multilayer film mirror 20 and the first contact layer 30.

The third semiconductor multilayer film mirror 24 is a semiconductor layer of a semi-insulating type. Here, the "semi-insulating semiconductor layer" denotes a layer formed of a semiconductor in which most of the carriers involved in the electric conduction are free electrons thermally excited from the valence band to the conduction band, or a corresponding number of holes generated in the valence band, and a variation in carrier density due to the existence of impurities and lattice defects is negligible. Specifically, the semi-insulating layer preferably denotes a layer formed of an intrinsic semiconductor, namely an i-type semiconductor.

The third semiconductor multilayer film mirror 24 is a distributed Bragg reflector (DBR) mirror having high-refractive index layers (not shown) and low-refractive index layers (not shown) alternately stacked on each other. The high-refractive index layers are each, for example, an i-type $Al_{0.15}Ga_{0.85}As$ layer doped with nothing. The low-refractive index layers are each, for example, an i-type $Al_{0.9}Ga_{0.1}As$ layer doped with nothing. The number of the high-refractive index layers and the low-refractive index layers stacked on each other (the number of pairs thereof) is preferably no smaller than 3 pairs and no larger than 40 pairs.

Figure 3:
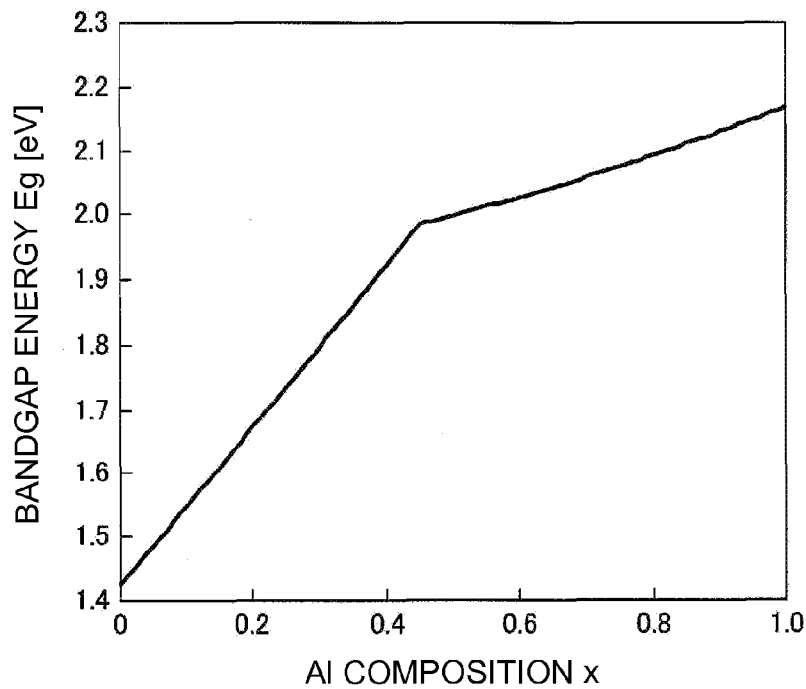
FIG. 3 is a graph showing the bandgap energy of $Al_xGa_{1-x}As$.

The third semiconductor multilayer film mirror 24 is formed of a material having a bandgap energy higher than the light energy generated in the active layer 40. Thus, in the light emitting device 100, it is possible to inhibit the light generated in the active layer 40 from being absorbed in the third semiconductor multilayer film mirror 24. Here, FIG. 3 is a graph showing the bandgap energy of $Al_xGa_{1-x}As$. In FIG. 3, the horizontal axis represents an Al component x of $Al_xGa_{1-x}As$, and the vertical axis represents the bandgap energy Eg of $Al_xGa_{1-x}As$. According to FIG. 3, the relationship between the Al component x and the bandgap energy Eg can be expressed as Formula (1) and Formula (2) below.

$$Eg=1.424+1.247x \text{ (if } 0<x\leq 0.45) \tag{1}$$

$$Eg=1.90+0.125x+0.145x^2 \text{ (if } 0.45<x\leq 1) \tag{2}$$

Assuming that the wavelength (the oscillation wavelength of the light oscillating of the light emitting device 100) of the light generated in the active layer 40 is 852 nm, the energy E of the light generated in the active layer 40 is 1.46 eV according to Formula (3) below.

$$E=hc/\lambda \tag{3}$$

It should be noted that in Formula (3), h is the Planck's constant, c is a speed of light, and λ is a wavelength of the light generated in the active layer 40.

Since the value of x with which Eg=1.46 eV is true (namely Eg=E is true) is x=0.03 according to Formula (1), by increasing x to a value higher than 0.03, it is possible to increase the bandgap energy of $Al_xGa_{1-x}As$ to a value higher than the energy of the light with the wavelength of 852 nm. Thus, it is possible to inhibit the light with the wavelength of 852 nm from being absorbed in $Al_xGa_{1-x}As$. In the case of x=0.15, since Eg=1.6 eV is obtained from Formula (1), by constituting the third semiconductor multilayer film mirror 24 by the $Al_{0.15}Ga_{0.85}As$ layers and the $Al_{0.9}Ga_{0.1}As$ layers as described above, it is possible to increase the bandgap energy of the third semiconductor multilayer film mirror 24 to a value higher than the energy of the light with the wavelength of 852 nm, and sufficiently suppress the light generated in the active layer 40 from being absorbed in the third semiconductor multilayer film mirror 24.

A voltage is applied to the third semiconductor multilayer film mirror 24 by the electrodes 60, 64. When the voltage is applied to the third semiconductor multilayer film mirror 24, the refractive index of the third semiconductor multilayer film mirror 24 varies due to an electrooptic effect. Specifically, the refractive index of the third semiconductor multilayer film mirror 24 varies due to the Kerr effect. In other words, in the third semiconductor multilayer film mirror 24, the refractive index varies in proportion to the square of the electric field intensity. The wavelength (the oscillation wavelength of the light emitting device 100) of the light generated in the active layer 40 can be varied by the refractive index variation due to the electrooptic effect of the third semiconductor multilayer film mirror 24. In other words, the oscillation wavelength of the light emitting device 100 can be varied (controlled) based on the voltage applied between the electrodes 60, 64.

As shown in FIG. 1, the first contact layer 30 is formed on the third semiconductor multilayer film mirror 24. The first contact layer 30 is formed between the third semiconductor multilayer film mirror 24 and the active layer 40. The first contact layer 30 is a semiconductor layer of the first conductivity type. Specifically, the first contact layer 30 is an n-type GaAs layer doped with Si.

The active layer 40 is formed on the first contact layer 30. The active layer 40 is formed between the semiconductor multilayer film mirrors 20, 22. In the example shown in the drawings, the active layer 40 is formed between the first contact layer 30 the second semiconductor multilayer film mirror 22.

Although not shown in the drawings, the active layer 40 is constituted by, for example, a first guide layer of the first conductivity type formed on the first contact layer 30, a quantum well layer formed on the first guide layer, and a second guide layer of a second conductivity type formed on the quantum well layer. The first guide layer is, for example, an n-type $Al_{0.3}Ga_{0.7}As$ layer doped with silicon. The quantum well layer has, for example, a multiple quantum well (MQW) structure having three layers of quantum well structures stacked one another each formed of an i-type GaAs layer and an i-type $Al_{0.3}Ga_{0.7}As$ layer. The second guide layer is, for example, a p-type $Al_{0.3}Ga_{0.7}As$ layer doped with carbon. A current is injected into the active layer 40 from the electrodes 62, 64, and thus, the active layer 40 can generate the light.

The second semiconductor multilayer film mirror 22 is formed on the active layer 40. The second semiconductor multilayer film mirror 22 is a semiconductor layer of the second conductivity type that is different from the first conductivity type. The second semiconductor multilayer film mirror 22 is a distributed Bragg reflector (DBR) mirror having high-refractive index layers (not shown) and low-refractive index layers (not shown) alternately stacked on each other. The high-refractive index layers are each, for example, a p-type $Al_{0.15}Ga_{0.85}As$ layer doped with carbon. The low-refractive index layers are each, for example, a p-type $Al_{0.9}Ga_{0.1}As$ layer doped with carbon. The number of the high-refractive index layers and the low-refractive index layers stacked on each other (the number of pairs thereof) is preferably no smaller than 10 pairs and no larger than 40 pairs.

It is also possible to form a current constriction layer 23 as shown in FIG. 1 by oxidizing at least one layer among the layers constituting the second semiconductor multilayer film mirror 22. The current constriction layer 23 is an insulating layer provided with an opening section 23a. The shape (hereinafter also referred to as a "planar shape") of the opening section 23a viewed from a stacking direction of the first semiconductor multilayer film mirror 20 and the active layer 40 can be a circular shape, and the current constriction layer 23 can be formed to have a ring-like shape.

The second contact layer 32 is formed on the second semiconductor multilayer film mirror 22. The second contact layer 32 is a semiconductor layer of the second conductivity type. Specifically, the second contact layer 32 is a p-type GaAs layer doped with carbon.

The second contact layer 32, the second semiconductor multilayer film mirror 22, and the active layer 40 constitute a columnar section 45. The planar shape of the columnar section 45 is, for example, a circular shape. As shown in FIG. 2, the columnar section 45 is formed inside the outer edge of the first contact layer 30 when viewed (hereinafter also referred to as "in the plan view") from the stacking direction of the first semiconductor multilayer film mirror 20 and the active layer 40. In other words, an upper surface of the first contact layer 30 has an area where the columnar section 45 is not formed, and in the area, there is formed the third electrode 64.

As shown in FIG. 1, the insulating layer 50 is formed on the first contact layer 30. The insulating layer 50 is formed in the periphery of the columnar section 45. The insulating layer 50 is, for example, an SiN layer, an $SiO_2$ layer, an SiON layer, an $Al_2O_3$ layer, or a polyimide layer. The insulating layer 50 is capable of electrically isolating the first contact layer 30 and the second semiconductor multilayer film mirror 22 from each other.

The first electrode 60 is formed below the substrate 10. The first electrode 60 has ohmic contact with the substrate 10. The first electrode 60 is electrically connected to the first semiconductor multilayer film mirror 20 via the substrate 10. The material of the first electrode 60 is metal such as Ti, Ni, Au, or Pt, or an alloy of any of these metals. The first electrode 60 is one of the electrodes for applying a voltage to the third semiconductor multilayer film mirror 24.

It should be noted that it is also possible to form a third contact layer (not shown) between the first semiconductor multilayer film mirror 20 and the substrate 10, expose the upper surface of the third contact layer using a dry etching process or the like, and then form the first electrode 60 on the third contact layer. Thus, a single-sided electrode structure can be obtained. This configuration is particularly effective in the case in which the substrate 10 has an insulation property.

The second electrode 62 is formed on the second contact layer 32 (on the columnar sections 45). The second electrode 62 has ohmic contact with the second contact layer 32. In the example shown in the drawings, the second electrode 62 is formed further on the insulating layer 50. The second electrode 62 is electrically connected to the second semiconductor multilayer film mirror 22 via the second contact layer 32.

The second electrode 62 is provided with an opening section 62a. The opening section 62a is located above the columnar section 45. In other words, the upper surface of the columnar section 45 has an area 46 where the second electrode 62 is not formed due to the opening section 62a. The planar shape of the area 46 is, for example, a circular shape. The area 46 forms an emission surface 46 of the light emitting device 100. The material of the second electrode 62 is metal such as Ti, Ni, Au, or Pt, or an alloy of any of these metals. The second electrode 62 is one of the electrodes for injecting the current into the active layer 40.

The third electrode 64 is formed on the first contact layer 30. The third electrode 64 has ohmic contact with the first contact layer 30. The material of the third electrode 64 is metal such as Ti, Ni, Au, or Pt, or an alloy of any of these metals. The third electrode 64 is the other of the electrodes for injecting the current into the active layer 40, and is the other of the electrodes for applying the voltage to the third semiconductor multilayer film mirror 24.

The voltage is applied between the electrodes 60, 64 by a first power supply 2. Thus, it is possible to apply the voltage to the third semiconductor multilayer film mirror 24. In the example shown in the drawings, the first power supply 2 applies the voltage between the electrodes 60, 64 so that the electric potential of the first electrode 60 becomes higher than the electric potential of the third electrode 64.

A voltage is applied between the electrodes 62, 64 by a second power supply 4 different from (i.e., independent of) the first power supply 2. Thus, the current can be injected into the active layer 40. In the example shown in the drawings, the second power supply 4 applies the voltage between the electrodes 62, 64 so that the electric potential of the second electrode 62 becomes higher than the electric potential of the third electrode 64.

In the light emitting device 100, the semiconductor multilayer film mirrors 20, 24, the active layer 40, and the second semiconductor multilayer film mirror 22 constitute a vertical resonator. Further, in the light emitting device 100, the second contact layer 32, the second semiconductor multilayer film mirror 22, the active layer 40, and the first contact layer 30 constitute a PIN diode.

In the light emitting device 100, when applying a forward voltage of the PIN diode between the electrodes 62, 64, recombination of electrons and holes occurs in the active layer 40 to thereby generate emission of light. The light generated in the active layer 40 reciprocates (is multiply reflected) between the semiconductor multilayer film mirrors 20, 24 and the second semiconductor multilayer film mirror 22, and is amplified in intensity due to stimulated emission occurring during the reciprocation. Then, when the optical gain exceeds the optical loss, laser oscillation occurs, and a laser beam is emitted from the emission surface 46 in a vertical direction with respect to the substrate 10 (in the stacking direction of the first semiconductor multilayer film mirror 20 and the active layer 40). Further, in the light emitting device 100, by applying the voltage between the electrodes 60, 64, the refractive index of the third semiconductor multilayer film mirror 24 can be varied due to the electrooptic effect. Thus, it is possible to change the oscillation wavelength of the light emitting device 100.

It should be noted that in the above description, there is explained the case in which the first semiconductor multilayer film mirror 20, the third semiconductor multilayer film mirror 24, the first contact layer 30, the active layer 40, the second semiconductor multilayer film mirror 22, and the second contact layer 32 are stacked on the substrate 10 in this order, the first semiconductor multilayer film mirror and the first contact layer 30 are each an n-type semiconductor layer, and the second semiconductor multilayer film mirror 22 and the second contact layer 32 are each a p-type semiconductor layer. Although not shown in the drawings, in the light emitting device according to the invention, it is also possible that the second semiconductor multilayer film mirror 22, the active layer 40, the first contact layer 30, the third semiconductor multilayer film mirror 24, the first semiconductor multilayer film mirror 20, and the second contact layer 32 are stacked on the substrate 10 in this order, the first semiconductor multilayer film mirror 20 and the contact layers 30, 32 are each a p-type semiconductor layer, and the second semiconductor multilayer film mirror 22 is an n-type semiconductor layer.

Further, although in the above description, the AlGaAs type light emitting device is explained, in the light emitting device according to the invention, it is also possible to use the semiconductor material of, for example, a GaInP type, a ZnSSe type, an InGaN type, an AlGaN type, an InGaAs type, a GaInNAs type, or a GaAsSb type in accordance with the oscillation wavelength.

The light emitting device 100 has, for example, the following features.

In the light emitting device 100, there are included the first electrode 60 electrically connected to the first semiconductor multilayer film mirror 20 of the first conductivity type, the second electrode 62 electrically connected to the second semiconductor multilayer film mirror 22 of the second conductivity type, and the third electrode 64 having ohmic contact with the first contact layer 30 of the first conductivity type, and the third semiconductor multilayer film mirror 24 of the semi-insulating type is formed of the material having the bandgap energy higher than the energy of the light generated in the active layer 40. Therefore, in the light emitting device 100, the absorption of the light generated in the active layer 40 can be suppressed in the third semiconductor multilayer film mirror 24, and the oscillation wavelength can be varied by varying the refractive index of the third semiconductor multilayer film mirror 24 using the electrooptic effect. Therefore, the oscillation wavelength can be varied with a small variation compared to the case of varying the oscillation wavelength using the light absorption in the semi-insulating semiconductor layer. As a result, in the light emitting device 100, the wavelength can be controlled with high accuracy. Specifically, in the light emitting device 100, the wavelength can be controlled in several picometers through hundred picometers (see the following experimental example).

In the light emitting device 100, the voltage is applied between the electrodes 60, 64 by the first power supply 2, and the voltage is applied between the electrodes 62, 64 by the second power supply 4 different from the first power supply 2. As described above, in the light emitting device 100, the voltages can be applied between the electrodes 60, and between the electrodes 62, 64 separately (independently) using the power supplies 2, 4.

1.2. Method of Manufacturing Light Emitting Device

Next, a method of manufacturing the light emitting device according to the first embodiment will be explained with reference to the accompanying drawings. FIGS. 4 through 7 are cross-sectional views schematically showing the manufacturing process of the light emitting device 100 according to the first embodiment, and each correspond to FIG. 1.

Figure 4:
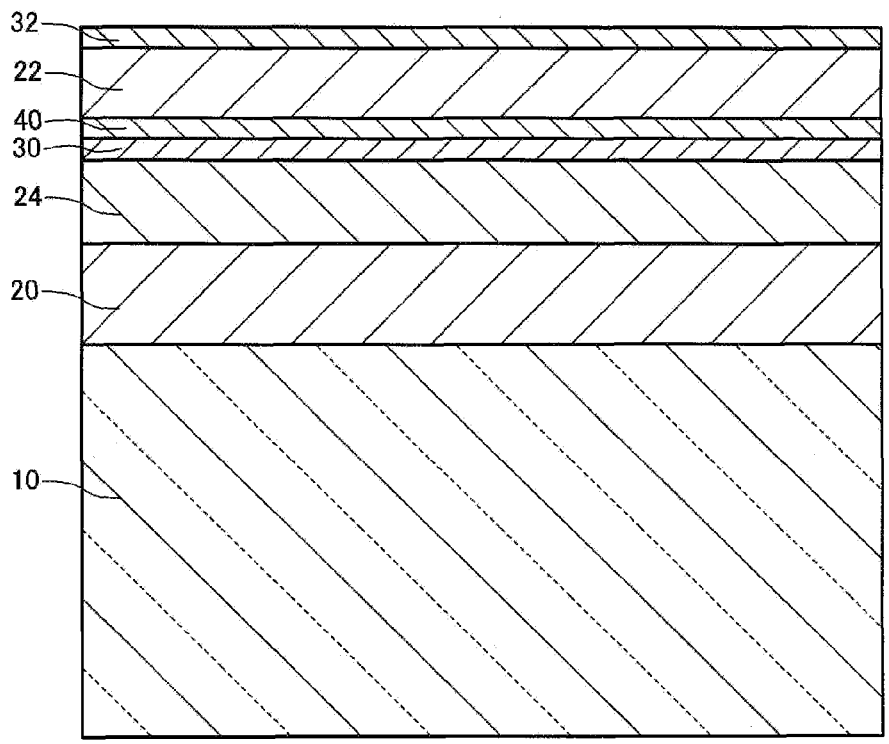
FIG. 4 is a cross-sectional view schematically showing a manufacturing process of the light emitting device according to the first embodiment.

As shown in FIG. 4, the first semiconductor multilayer film mirror 20, the third semiconductor multilayer film mirror 24, the first contact layer 30, the active layer 40, the second semiconductor multilayer film mirror 22, and the second contact layer 32 are grown epitaxially on the substrate 10 in this order. As the method of epitaxially growing the layers, there can be cited, for example, a metal organic chemical vapor deposition (MOCVD) method, and a molecular beam epitaxy (MBE) method.

Figure 5:
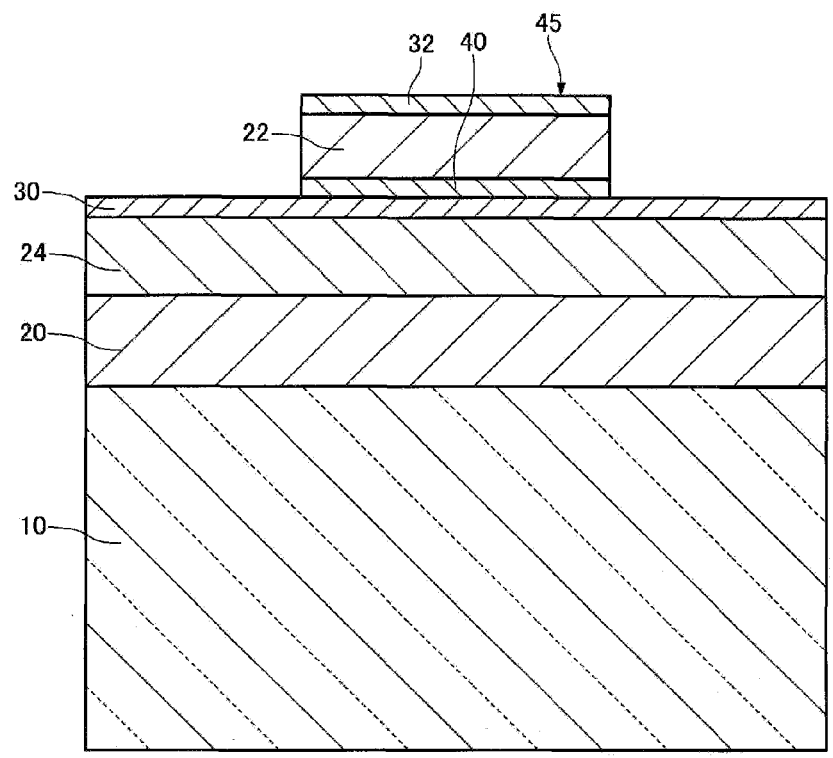
FIG. 5 is a cross-sectional view schematically showing the manufacturing process of the light emitting device according to the first embodiment.

As shown in FIG. 5, the second contact layer 32, the second semiconductor multilayer film mirror 22, and the active layer 40 are patterned to form the columnar section 45. The patterning is performed using, for example, a photolithography process and an etching process.

Figure 6:
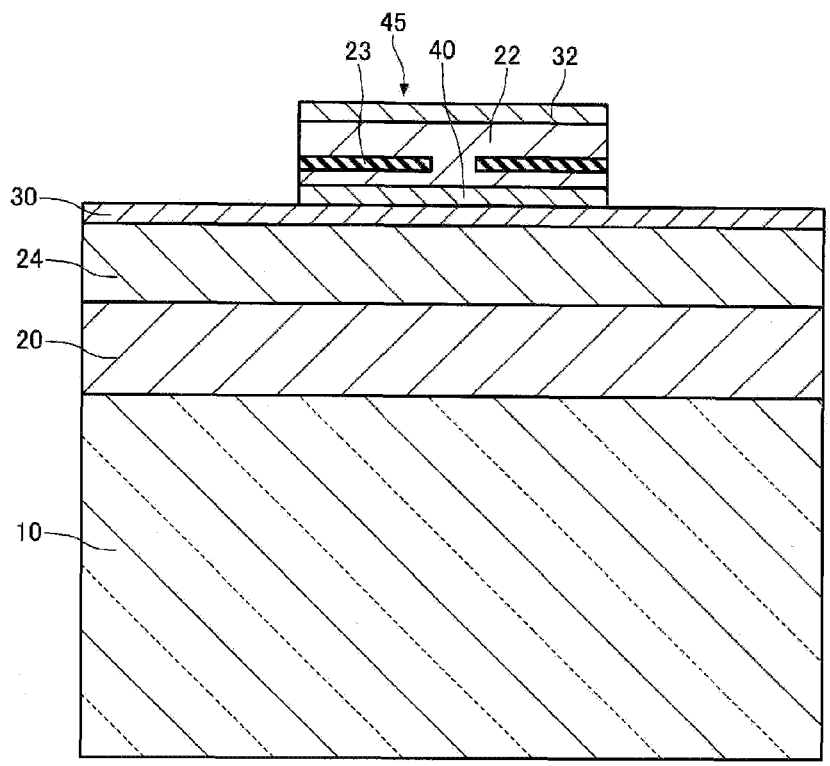
FIG. 6 is a cross-sectional view schematically showing the manufacturing process of the light emitting device according to the first embodiment.

As shown in FIG. 6, at least one layer among the layers constituting the second semiconductor multilayer film mirror 22 is oxidized to form the current constriction layer 23. Specifically, by setting the one layer among the layers constituting the second semiconductor multilayer film mirror 22 to the $Al_{1-x}Ga_xAs$ ($x \geq 0.95$) layer, and oxidizing this layer, the current constriction layer 23 is formed. For example, the $Al_{1-x}Ga_xAs$ ($x \geq 0.95$) layer is oxidized from the side surface by putting the substrate 10 provided with the columnar section 45 and so on into a water-vapor atmosphere at about 400° C. to thereby form the current constriction layer 23.

Figure 7:
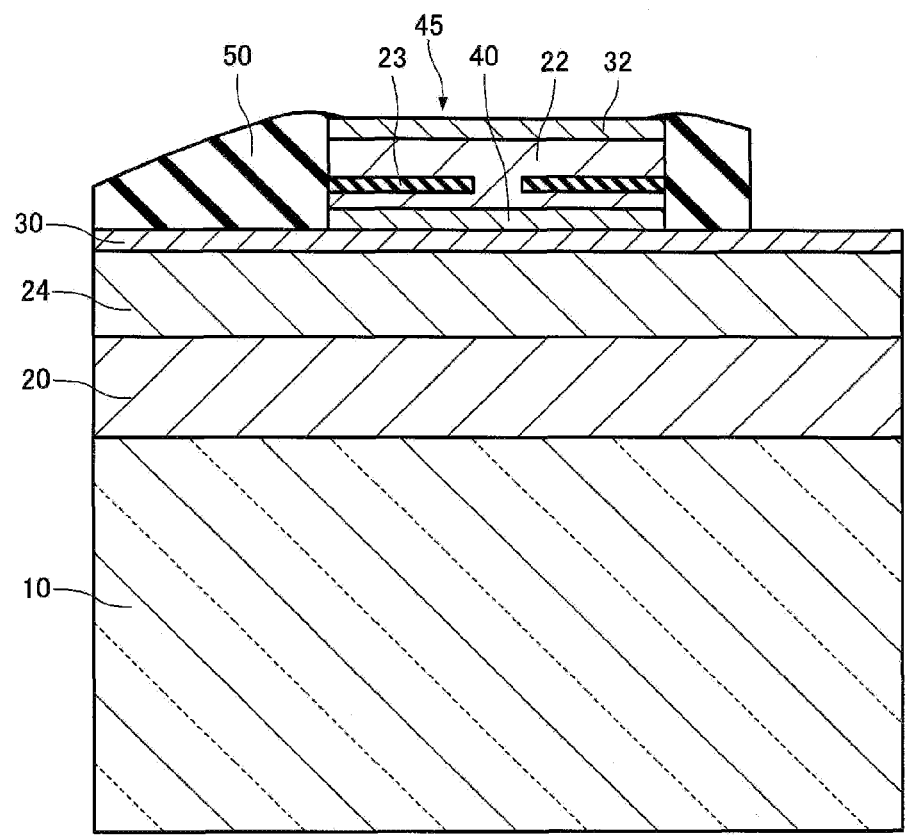
FIG. 7 is a cross-sectional view schematically showing the manufacturing process of the light emitting device according to the first embodiment.

As shown in FIG. 7, the insulating layer 50 is formed on the first contact layer 30 so as to surround the columnar section 45. The insulating layer 50 is formed by forming a layer made of polyimide resin or the like on the upper surface of the first contact layer 30 and the entire surfaces of the columnar section 45 using, for example, a spin coating method or the like, and then patterning this layer. The patterning is performed using, for example, a photolithography process and an etching process.

As shown in FIG. 1, the first electrode 60 is formed below the substrate 10, the second electrode 62 is formed on the second contact layer 32 and the insulating layer 50, and then the third electrode 64 is formed on the first contact layer 30. The electrodes 60, 62, and 64 are formed using, for example, a combination of a vacuum deposition method and a liftoff method. It should be noted that the order of forming the electrodes 60, 62, and 64 is not particularly limited.

According to the process described hereinabove, the light emitting device 100 can be manufactured.

1.3. Experimental Example

Hereinafter, an experimental example will be shown, and the present embodiment of the invention will more specifically be explained. It should be noted that the invention is not at all limited by the following experimental example.

1.3.1. Configuration of Light Emitting Device (1) Example 1

As Example 1, the light emitting device shown in FIG. 1 was used. As the substrate 10, an n-type GaAs substrate was used. As the first semiconductor multilayer film mirror 20, there was used what was obtained by alternately stacking 20 pairs of n-type $Al_{0.15}Ga_{0.85}As$ layers and n-type $Al_{0.9}Ga_{0.1}As$ layers on each other. As the third semiconductor multilayer film mirror 24, there was used what was obtained by alternately stacking 5 pairs of i-type $Al_{0.15}Ga_{0.85}As$ layers and i-type $Al_{0.9}Ga_{0.1}As$ layers on each other. As the first contact layer 30, an n-type GaAs layer was used. As the active layer 40, there was used what was obtained by stacking an n-type $Al_{0.3}Ga_{0.7}As$ layer, the quantum well layer formed of an i-type GaAs layer and an i-type $Al_{0.3}Ga_{0.7}As$ layer, and a p-type $Al_{0.3}Ga_{0.7}As$ layer on each other. As the second semiconductor multilayer film mirror 22, there was used what was obtained by alternately stacking 25 pairs of p-type $Al_{0.15}Ga_{0.85}As$ layers and p-type $Al_{0.9}Ga_{0.1}As$ layers on each other. As the second contact layer 32, a p-type GaAs layer was used.

(2) Example 2

As Example 2, a light emitting device, which was the same as in Example 1 except the fact that the number of pairs in the third semiconductor multilayer film mirror 24 was changed to 10, was used.

(3) Example 3

As Example 3, a light emitting device, which was the same as in Example 1 except the fact that the number of pairs in the third semiconductor multilayer film mirror 24 was changed to 20, was used.

1.3.2. Wavelength Variation Investigation

Figure 8:
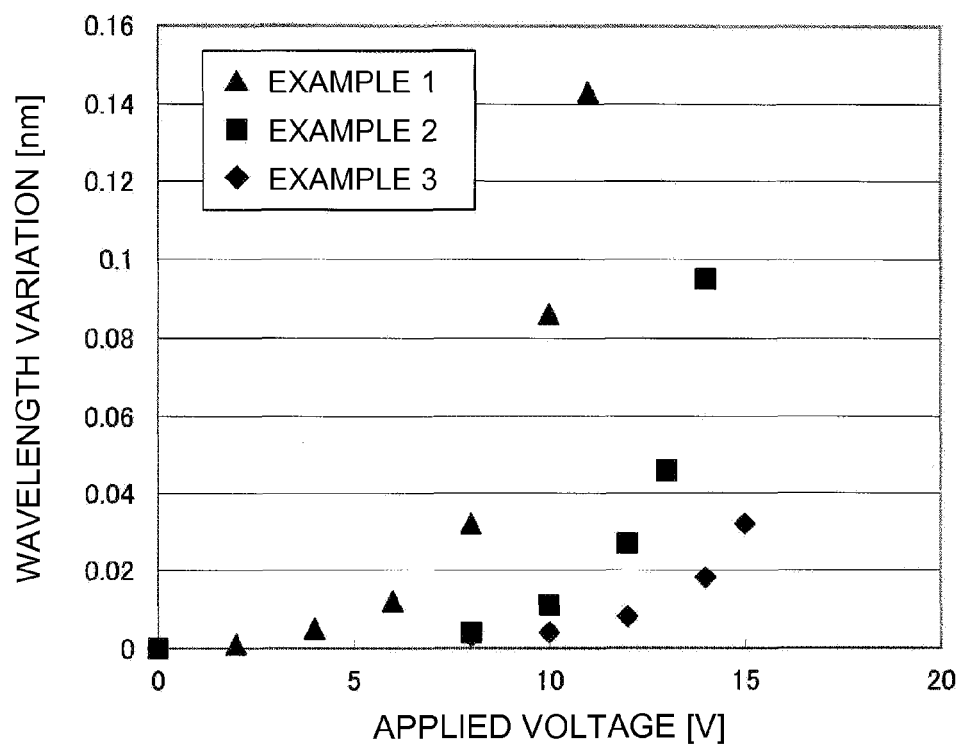
FIG. 8 is a graph showing a relationship between a voltage applied between a first electrode and a third electrode of the light emitting device and a wavelength variation.

A voltage was applied between the electrodes 60, 64 of each of Examples 1 through 3, and the variation in the oscillation wavelength (the wavelength of the light emitted from the light emitting device) was investigated. FIG. 8 is a graph showing a relationship between the applied voltage between the electrodes 60, 64 and the variation in the wavelength.

According to FIG. 8, it was figured out that the wavelength could be varied in several picometers through several hundreds of picometers. For example, in the case of varying the wavelength using the light absorption in the semi-insulating semiconductor layer, it is difficult to vary the wavelength in several hundreds of picometers.

Further, according to FIG. 8, it was figured out that the smaller the number of pairs in the third semiconductor multilayer film mirror 24 was, the larger the wavelength variation with respect to the applied voltage became. This is because the smaller the number of pairs in the third semiconductor multilayer film mirror 24 is, the stronger the electric field in the third semiconductor multilayer film mirror 24 becomes.

2. Second Embodiment

2.1. Light Emitting Device

Figure 9:
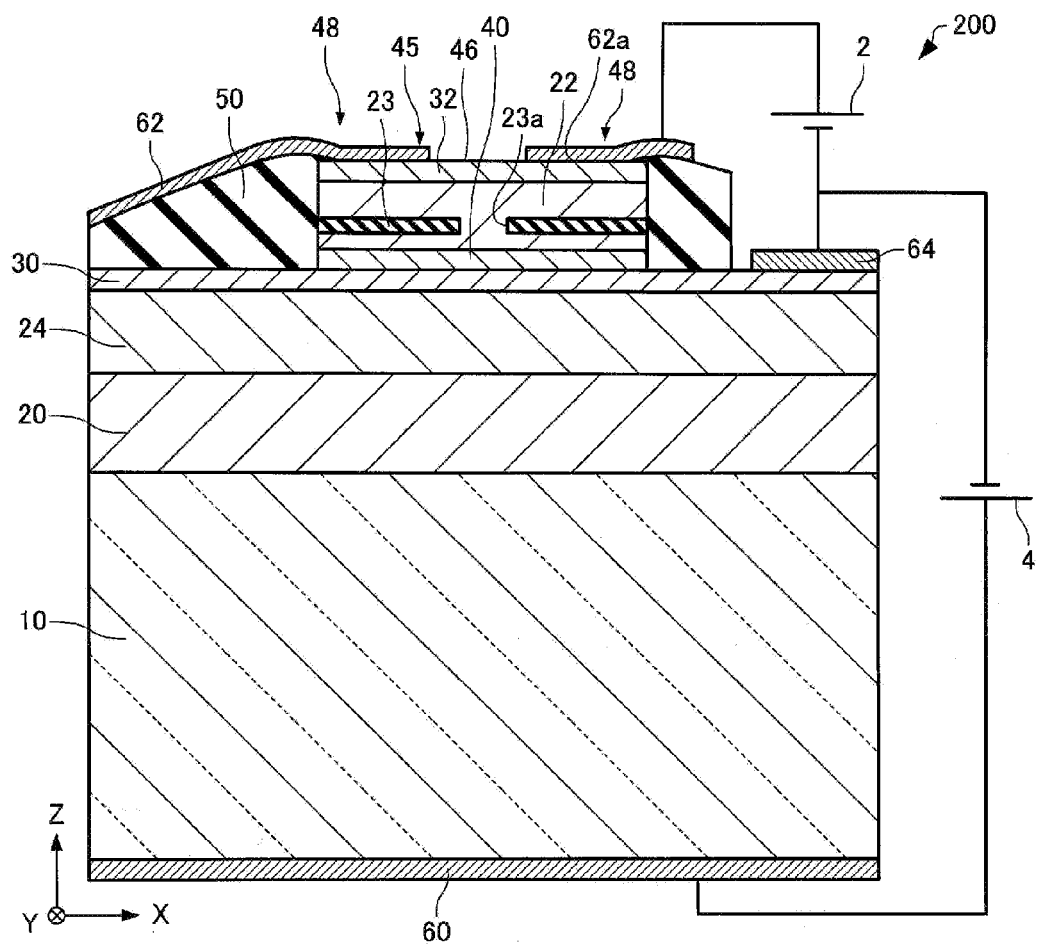
FIG. 9 is a cross-sectional view schematically showing a light emitting device according to a second embodiment of the invention.
Figure 10:
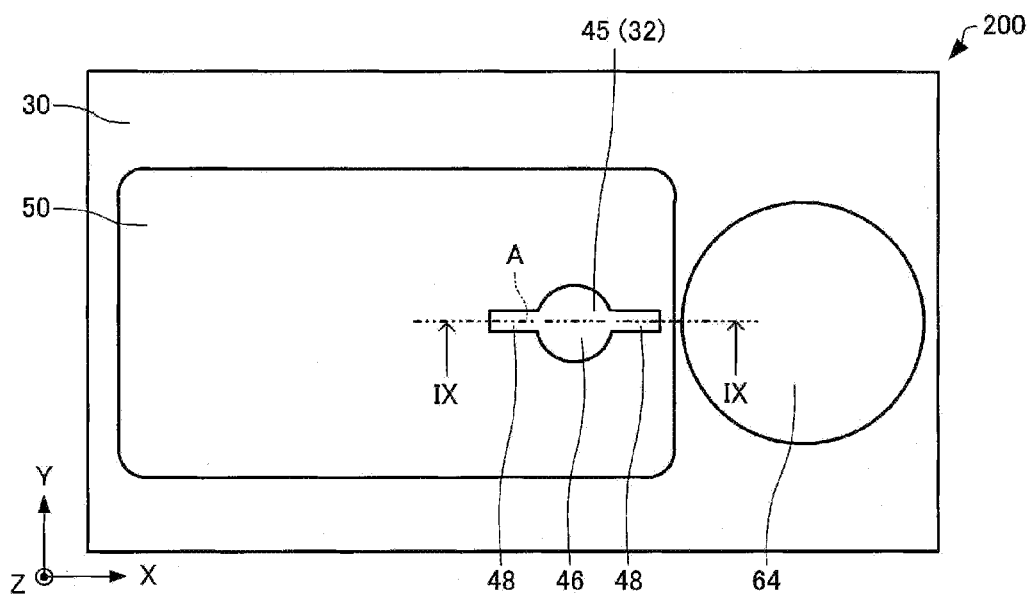
FIG. 10 is a plan view schematically showing the light emitting device according to the second embodiment.

Next, a light emitting device according to a second embodiment will be explained with reference to the accompanying drawings. FIG. 9 is a cross-sectional view schematically showing the light emitting device 200 according to the second embodiment. FIG. 10 is a plan view schematically showing the light emitting device 200 according to the second embodiment. It should be noted that FIG. 9 is a cross-sectional view along the IX-IX line shown in FIG. 10. Further, in FIG. 10, the second electrode 62 is omitted from the drawing for the sake of convenience. Further, in FIGS. 9 and 10, and in FIG. 11 described below, an X axis, a Y axis, and a Z axis are shown as three axes perpendicular to each other for the sake of convenience. Hereinafter, in the light emitting device 200, members having the same functions as those of the constituents of the light emitting device 100 described above will be denoted with the same reference symbols, and detailed explanation thereof will be omitted.

As shown in FIGS. 9 and 10, the light emitting device 200 is different from the light emitting device 100 in the point that polarization sections 48 are provided.

The polarization sections 48 each have a semiconductor layer configured integrally with the columnar section 45. In the example shown in the drawings, the semiconductor layer of the polarization section 48 corresponds to the active layer 40, the second semiconductor multilayer film mirror 22, and the second contact layer 32, and the polarization sections 48 are formed integrally with the columnar section 45. As shown in FIG. 9, it is also possible to form the second electrode 62 on the polarization sections 48.

There are formed two polarization sections 48, for example. The polarization sections 48 each project from the columnar section 45 in the X-axis direction (the first direction). As shown in FIG. 10, in the plan view, an imaginary straight line A passing through the center of the end surface of the polarization section 48 projecting from the columnar section 45 in the +X-axis direction and the center of the end surface of the polarization section 48 projecting from the columnar section 45 in the −X-axis direction can also be parallel to the X axis.

The polarization sections 48 provide the active layer 40 with a distortion to polarize the light generated in the active layer 40. Here, "to polarize the light" denotes that the vibration direction of the electric field of the light is made constant. The semiconductor layer constituting the polarization sections 48 functions as a generation source for generating the distortion to be provided to the active layer 40. In general, when depositing a thin film, which is made of a material different from the material of the substrate, on the substrate, a stress is generated in the boundary between the substrate and the thin film or inside the thin film in accordance with the material or the deposition condition. Due to the stress, the polarization sections 48 provide the active layer 40 with the distortion.

Figure 11:
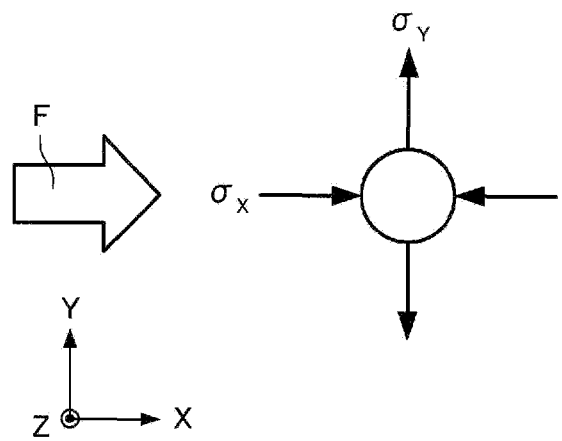
FIG. 11 is a diagram for explaining the variation of the refractive index of an active layer due to an external force applied to the active layer by a polarization section.

When the distortion occurs in the active layer 40 by the polarization sections 48, the active layer 40 shows birefringence due to a photo-elastic effect. Specifically, as shown in FIG. 11, the active layer 40 shows the birefringence different in refractive index between the X-axis direction and the Y-axis direction due to the external force F applied to the active layer 40 by the polarization sections 48. In the example shown in FIG. 11, there is shown the case in which a compressive stress $\alpha_X$ is generated in the X-axis direction (the projection direction of the polarization sections 48 from the columnar section 45), and a tensile stress $\sigma_Y$ is generated in the Y-axis direction in the active layer 40. It is possible for the polarization sections 48 to polarize the light generated in the active layer 40 using the difference in refractive index between the refractive index $n_X$ in the X-axis direction and the refractive index $n_Y$ in the Y-axis direction. Specifically, the direction of the electric field of the light generated in the active layer 40 becomes the projection direction (the X-axis direction) of the polarization sections 48 from the columnar section 45, or the direction (the Y-axis direction) perpendicular thereto. Specifically, the polarization plane of the light generated in the active layer 40 becomes the X-Z plane or the Y-Z plane. The distance B between $n_X$ and $n_Y$ is expressed as Formula (4) below.

$$B = n_X - n_Y = C(\sigma_X - \sigma_Y) \quad (4)$$

It should be noted that in Formula (4), C is a photoelastic constant.

It should be noted that FIG. 11 is a diagram for explaining the fact that the refractive index of the active layer 40 varies due to the external force F applied to the active layer 40 by the polarization sections 48, and the stacking direction of the first semiconductor multilayer film mirror 20 and the active layer 40 is the Z-axis direction. In other words, the proceeding direction (the oscillation direction) of the light is the Z-axis direction.

Further, although not shown in the drawings, in some cases, the tensile stress is generated in the X-axis direction, and the compressive stress is generated in the Y-axis direction in the active layer 40. The directions of the compressive stress and the tensile stress generated in the active layer 40 are determined in accordance with the material constituting the polarization sections 48 and the deposition condition thereof.

Further, the material, the shape, and the number of the polarization sections 48 are not particularly limited providing the light generated in the active layer 40 can be polarized by applying the distortion to the active layer 40. Further, the polarization sections 48 can be formed separated from the columnar section 45.

The third semiconductor multilayer film mirror 24 has an index ellipsoid in the state in which a voltage is applied between the electrodes 60, 64. The "index ellipsoid" schematically represents the refractive index in the light with the electric field vibrating in a variety of directions, and the distance from the center directly represents the refractive index.

Figure 12:
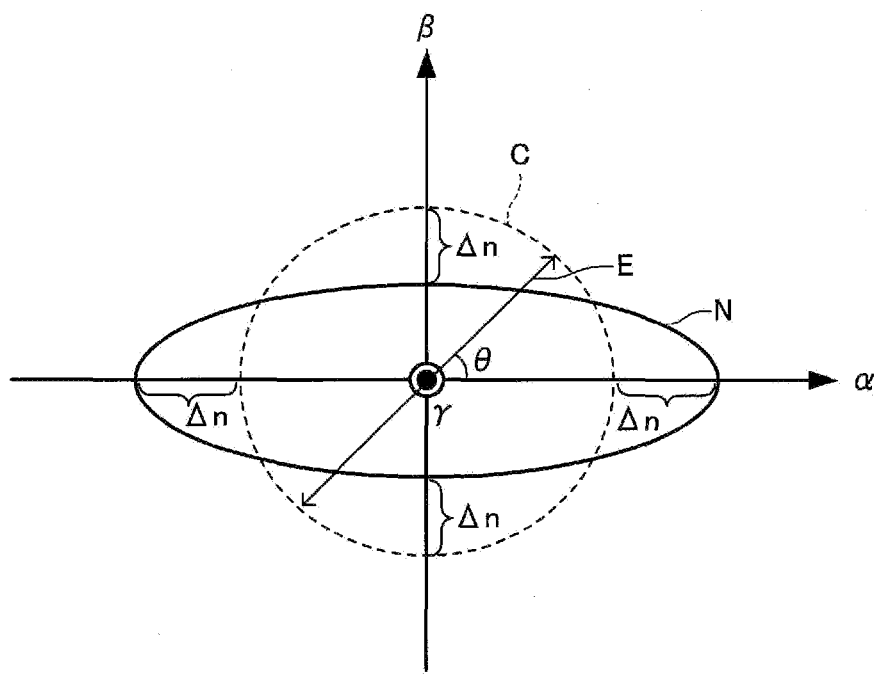
FIG. 12 is a diagram schematically showing an index ellipsoid of a third semiconductor multilayer mirror in the state in which a voltage is applied between a first electrode and a third electrode of the light emitting device according to the second embodiment.

FIG. 12 is a diagram schematically showing the index ellipsoid N of the third semiconductor multilayer film mirror 24 in the state in which a voltage is applied between the electrodes 60, 64. In FIG. 12, an $\alpha$ axis, a $\beta$ axis, and a $\gamma$ axis are shown as three axes perpendicular to each other. In FIG. 12, the stacking direction of the first semiconductor multilayer film mirror 20 and the active layer 40 is the $\gamma$-axis direction. In other words, the proceeding direction (the oscillation direction) of the light is the $\gamma$-axis direction.

As shown in FIG. 12, the index ellipsoid N has along axis in the $\alpha$-axis direction, and a short axis in the $\beta$-axis direction. Therefore, the third semiconductor multilayer film mirror 24 has a higher refractive index for the light having the electric field vibrating in the $\alpha$-axis direction than for the light having the electric field vibrating in the $\beta$-axis direction. In other words, in the third semiconductor multilayer film mirror 24, a higher refractive index is felt in the light having the electric field vibrating in the $\alpha$-axis direction than in the light having the electric field vibrating in the $\beta$-axis direction. The long-axis direction and the short-axis direction of the index ellipsoid N are uniquely determined in accordance with the material of the semiconductor layer constituting the third semiconductor multilayer film mirror 24.

Further, FIG. 12 schematically shows the refractive index of the third semiconductor multilayer film mirror 24 in the state in which no voltage is applied between the electrodes 60, 64 as a circle (true circle) C. It is assumed that by applying a voltage between the electrodes 60, 64, the refractive index varies by $\Delta n$ in the $\alpha$-axis direction and the $\beta$-axis direction to thereby obtain the index ellipsoid N. On this occasion, the refractive index varies by $\Delta n$ for the light having the electric field vibrating in the $\alpha$-axis direction and the light having the electric field vibrating in the $\beta$-axis direction. For example, as shown in FIG. 12, for the light having the electric field vibrating in a direction E tilted by $\theta(=45°)$ with respect to the $\alpha$ axis, the refractive index varies by a value smaller than $\Delta n$. In other words, the variation in refractive index of the third semiconductor multilayer film mirror 24 depends on the tilt $\theta$ of the vibrating direction E of the electric field of the light generated in the active layer 40 with respect to the long-axis direction of the index ellipsoid N.

Therefore, by controlling the vibration direction of the electric field of the light using the polarization sections 48, the variation in refractive index in the third semiconductor multilayer film mirror 24 can be controlled. Since the vibration direction of the electric field of the light depends on the projection direction of the polarization sections 48 from the columnar section 45 as described above, the variation in refractive index in the third semiconductor multilayer film mirror 24 can be controlled using the projection direction of the polarization section 48.

For example, in the case of attempting to increase the variation in refractive index in the third semiconductor multilayer film mirror 24, the projection direction (the X-axis direction) of the polarization sections 48 from the columnar section 45 and the long-axis direction (the α-axis direction) of the index ellipsoid N are made to coincide with each other. Alternatively, the projection direction (the X-axis direction) of the polarization sections 48 from the columnar section 45 and the short-axis direction of the index ellipsoid N (the β-axis direction) are made to coincide with each other. Thus, the vibration direction of the electric field of the light generated in the active layer 40 can be set to the long-axis direction or the short-axis direction of the index ellipsoid N, and thus, the variation in refractive index in the third semiconductor multilayer film mirror 24 can be increased.

It should be noted that it is preferable that the direction in which the refractive index is increased due to the photoelastic effect and the long-axis direction of the index ellipsoid N coincide with each other. If, for example, the direction in which the refractive index is increased due to the photoelastic effect and the short-axis direction of the index ellipsoid N are made to coincide with each other, there is a case in which in the effective refractive index in the stacking direction of the first semiconductor multilayer film mirror 20 and the active layer 40, the refractive index variation due to the photoelastic effect and the refractive index variation due to the electrooptic effect in the third semiconductor multilayer film mirror 24 are canceled out with each other, and thus, it is not achievable to polarize the light generated in the active layer 40.

Further, although the means for increasing the variation in refractive index in the third semiconductor multilayer film mirror 24 is explained above, even if the variation in oscillation wavelength is increased using that means, the order of the variation is in a range of several picometers through several hundreds of picometers, and it is possible for the light emitting device 200 to control the wavelength with high accuracy.

The light emitting device 200 has, for example, the following features.

The light emitting device 200 includes the polarization sections 48 for polarizing the light generated in the active layer 40. As described above, the variation in refractive index of the third semiconductor multilayer film mirror 24 in the state in which a voltage is applied between the electrodes 60, 64 depends on the tilt θ of the vibrating direction of the electric field of the light generated in the active layer 40 with respect to the long-axis direction of the index ellipsoid N of the third semiconductor multilayer film mirror 24. Therefore, in the light emitting device 200, the variation in refractive index in the third semiconductor multilayer film mirror 24 can be controlled using the polarization sections 48.

In the light emitting device 200, the polarization sections 48 include the semiconductor layer configured integrally with the columnar section 45, and the polarization sections 48 provide the active layer 40 with the distortion using the semiconductor layer to thereby polarize the light generated in the active layer 40. Therefore, it is not necessary to increase the manufacturing process for forming the polarization sections 48, and thus, the cost can be suppressed.

In the light emitting device 200, the polarization sections 48 project from the columnar section 45 in the first axis direction (the X-axis direction) viewed from the stacking direction of the first semiconductor multilayer film mirror 20 and the active layer 40, and the X-axis direction coincides with the long-axis direction or the short-axis direction of the index ellipsoid N of the third semiconductor multilayer film mirror 24 in the state in which a voltage is applied between the electrodes 60, 64. Therefore, it is possible to inhibit the refractive index variation due to the photoelastic effect and the refractive index variation due to the electrooptic effect in the third semiconductor multilayer film mirror 24 from being canceled out with each other in the effective refractive index in the stacking direction of the first semiconductor multilayer film mirror 20 and the active layer 40. As a result, it is possible to more surely polarize the light generated in the active layer 40.

2.2. Method of Manufacturing Light Emitting Device

Next, a method of manufacturing the light emitting device according to the second embodiment will be explained. The method of manufacturing the light emitting device 200 according to the second embodiment is basically the same as the method of manufacturing the light emitting device 100 according to the first embodiment except the point that the polarization sections 48 are formed integrally with the columnar section 45. Therefore, the detailed explanation thereof will be omitted.

2.3. Modified Example of Light Emitting Device

Figure 13:
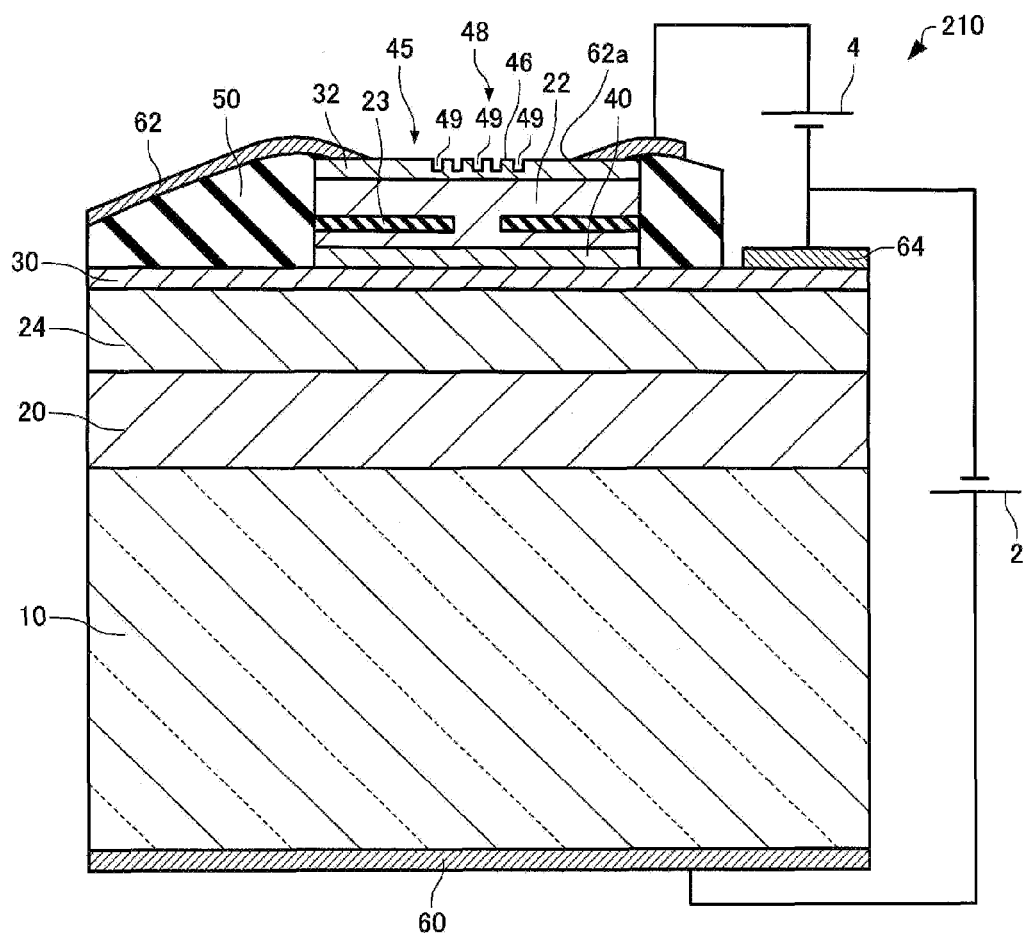
FIG. 13 is a cross-sectional view schematically showing a light emitting device according to a modified example of the second embodiment.
Figure 14:
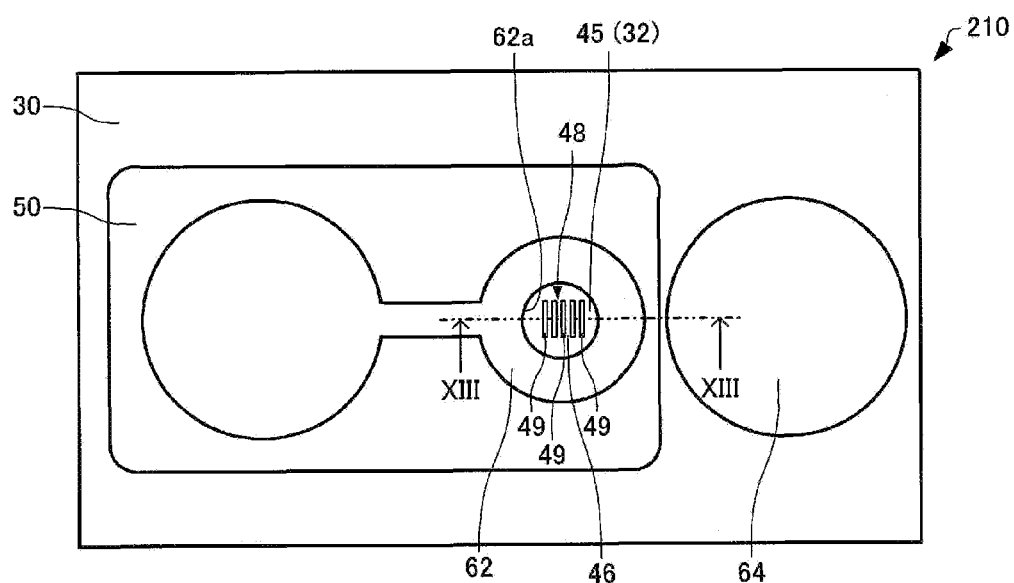
FIG. 14 is a plan view schematically showing the light emitting device according to the modified example of the second embodiment.

Next, a light emitting device according to a modified example of the second embodiment will be explained with reference to the accompanying drawings. FIG. 13 is a cross-sectional view schematically showing the light emitting device 210 according to the modified example of the second embodiment. FIG. 14 is a plan view schematically showing the light emitting device 210 according to the modified example of the second embodiment. It should be noted that FIG. 13 is a cross-sectional view along the XIII-XIII line shown in FIG. 14. Hereinafter, in the light emitting device 210, members having the same functions as those of the constituents of the light emitting devices 100, 200 described above will be denoted with the same reference symbols, and detailed explanation thereof will be omitted.

As shown in FIGS. 9 and 10, in the light emitting device 200, the polarization sections 48 provide the active layer 40 with a distortion to polarize the light generated in the active layer 40. In contrast, in the light emitting device 210, as shown in FIGS. 13 and 14, the polarization section 48 functions as a diffraction grating (grating), and polarize the light generated in the active layer 40.

In the light emitting device 210, the polarization section 48 is formed of groove sections 49 formed periodically on the emission surface 46. In the example shown in FIG. 14, the planar shape of each of the groove sections 49 is a rectangle. In the light emitting device 210, the vibrating direction of the electric field of the light generated in the active layer 40 can be controlled using the depth and the shape of the groove section 49 and the pitch of the polarization section 48. The groove sections 49 are formed by patterning using the photolithography process and the etching process.

In the light emitting device 210, similarly to the light emitting device 200, the variation in refractive index of the third semiconductor multilayer film mirror 24 can be controlled using the polarization section 48.

It should be noted that the configuration of the polarization section 48 is not particularly limited providing the light generated in the active layer 40 can be polarized.

3. Third Embodiment

Figure 15:
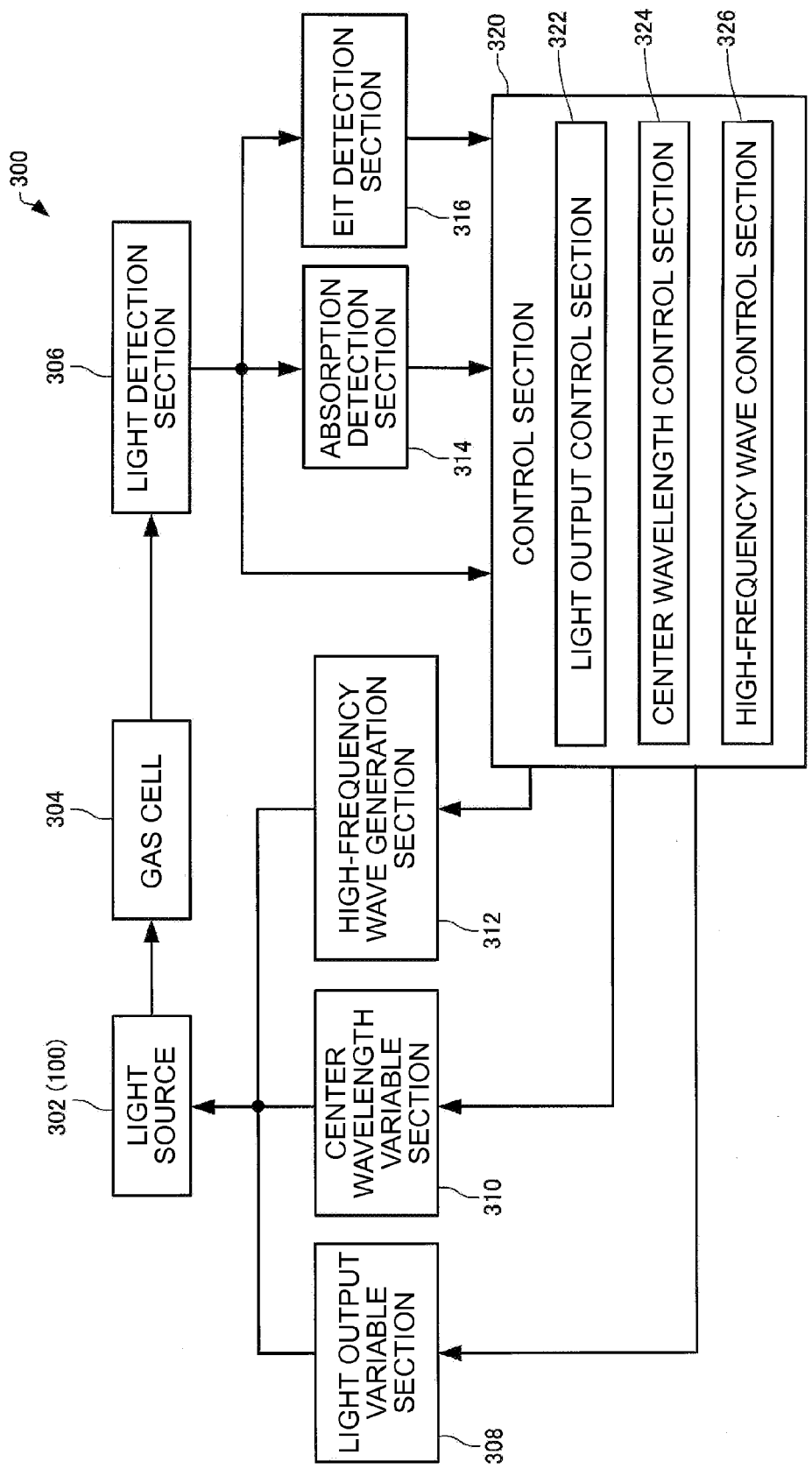
FIG. 15 is a functional block diagram of an atomic oscillator according to a third embodiment of the invention.

Next, an atomic oscillator according to a third embodiment will be explained with reference to the accompanying drawings. FIG. 15 is a functional block diagram of the atomic oscillator 300 according to the third embodiment.

As shown in FIG. 15, the atomic oscillator 300 includes a light source 302, a gas cell 304, a light detection section 306, a light output variable section 308, a center wavelength variable section (a center frequency variable section) 310, a high-frequency wave generation section 312, an absorption detection section 314, an EIT detection section 316, and a control section 320. The control section 320 includes a light output control section 322, a center wavelength control section (a center frequency control section) 324, and a high-frequency wave control section 326. The atomic oscillator 300 makes an alkali metal atom generate the EIT phenomenon using a resonant light pair (a first light beam and a second light beam) having two frequency components that are different from each other.

As the light source 302, the light emitting device according to the invention is used. Hereinafter, an example of using the light emitting device 100 as the light emitting device according to the invention will be explained.

Figure 16:
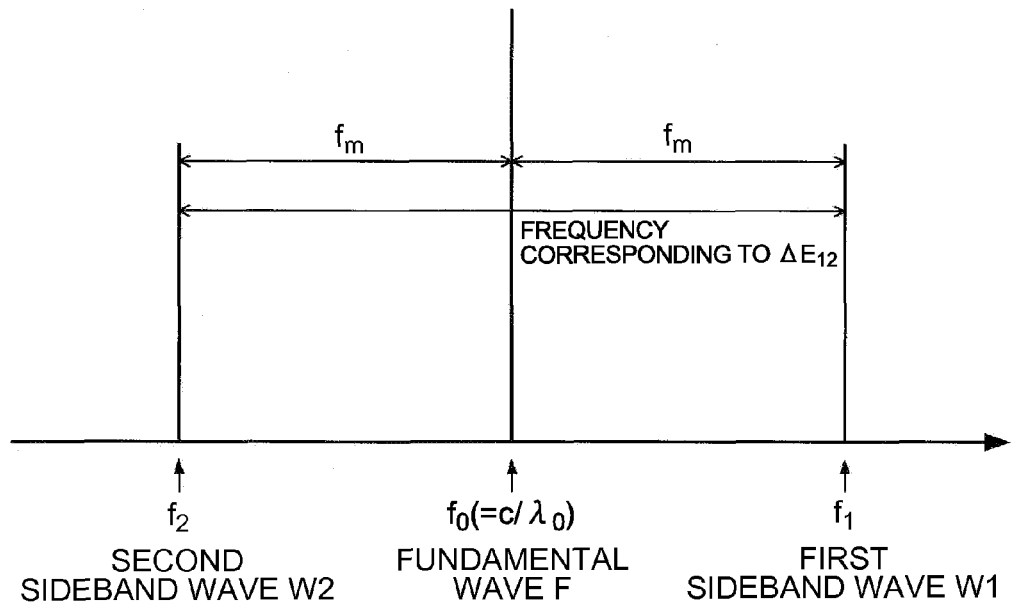
FIG. 16 is a diagram showing a frequency spectrum of resonant light.
Figure 17:
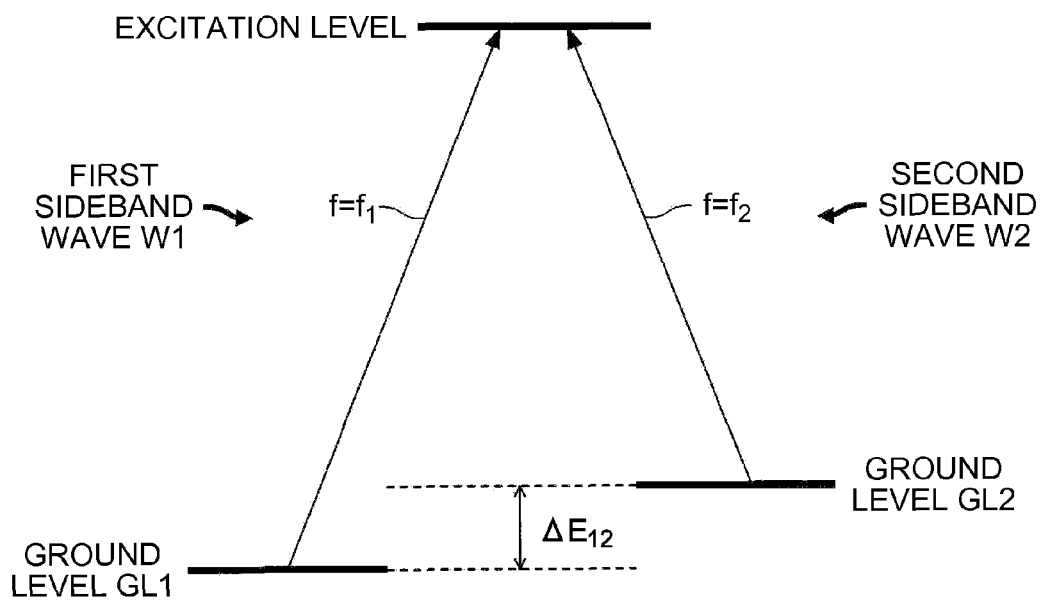
FIG. 17 is a diagram showing a relationship between a Λ-type three-level model of an alkali metal atom, and a first sideband wave and a second sideband wave.

The light source 302 generates the first light beam and the second light beam different in frequency from each other, and irradiates the alkali metal atom with the first and second light beams. Here, FIG. 16 is a diagram showing a frequency spectrum of the resonant light. FIG. 17 is a diagram showing a relationship between a Λ-type three-level model of the alkali metal atom, and the first sideband wave (the first light beam) W1 and the second sideband wave (the second light beam) W2. The light L emitted from the light source 302 includes a fundamental wave F having the center frequency $f_0$ ($=c/\lambda_0$: c denotes the speed of light; and $\lambda_0$ denotes the center wavelength of a laser beam), the first sideband wave W1 having the frequency $f_1$ in the upper sideband with respect to the center frequency $f_0$, and the second sideband wave W2 having the frequency $f_2$ in the lower sideband with respect to the center frequency $f_0$. The frequency $f_1$ of the first sideband wave W1 is obtained as $f_1=f_0+f_m$, and the frequency $f_2$ of the second sideband wave W2 is obtained as $f_2=f_0-f_m$.

As shown in FIG. 17, the frequency difference between the frequency $f_1$ of the first sideband wave W1 and the frequency $f_2$ of the second sideband wave W2 coincides with the frequency corresponding to the energy difference $\Delta E_{12}$ between the ground level GL1 and the ground level GL2 of the alkali metal atom. Therefore, the alkali metal atom causes the EIT phenomenon with the first sideband wave W1 having the frequency $f_1$ and the second sideband wave W2 having the frequency $f_2$.

Here, the EIT phenomenon will be explained. There is known that the interaction between the alkali metal atom and the light can be explained with the Λ-type three-level model. As shown in FIG. 17, the alkali metal atom has the two ground levels, and if the alkali metal atom is irradiated with either one of the first sideband wave W1 having the wavelength (frequency $f_1$) corresponding to the energy difference between the ground level GL1 and the excitation level, and the second sideband wave W2 having the wavelength (frequency $f_2$) corresponding to the energy difference between the ground level GL2 and the excitation level alone, light absorption occurs. However, as shown in FIG. 16, if the alkali metal atom is irradiated simultaneously with the first sideband wave W1 and the second sideband wave W2 having the respective frequencies $f_1$, $f_2$ the difference of which ($f_1-f_2$) accurately coincides with the frequency corresponding to the energy difference $\Delta E_{12}$ between the ground level GL1 and the ground level GL2, a superposition state of the two ground levels, namely the quantum interference state, occurs to thereby cause a transparency phenomenon (the EIT phenomenon) in which the excitation to the excitation level stops, and the first sideband wave W1 and the second sideband wave W2 are transmitted through the alkali metal atom. By detecting and then controlling the steep variation in the light absorption behavior occurring when the frequency difference $f_1-f_2$ between the first sideband wave W1 and the second sideband wave W2 is shifted from the frequency corresponding to the energy difference $\Delta E_{12}$ between the ground level GL1 and the ground level GL2 using the EIT phenomenon, a highly accurate oscillator can be manufactured.

The gas cell 304 has the gaseous alkali metal atoms (e.g., sodium atoms, rubidium atoms, or cesium atoms) encapsulated in a container. When the gas cell 304 is irradiated with the two light waves (the first light beam and the second light beam) having the frequency (wavelength) difference corresponding to the energy difference between the two ground levels of the alkali metal atom, the alkali metal atom causes the EIT phenomenon. If, for example, the alkali metal atom is the cesium atom, the frequency corresponding to the energy difference between the ground level GL1 at the D1 line and the ground level GL2 is 9.19263 . . . GHz, and therefore, the EIT phenomenon occurs in response to the irradiation with the two light waves having the frequency difference of 9.19263 . . . GHz.

The light detection section 306 detects the intensity of the light transmitted through the alkali metal atom encapsulated in the gas cell 304. The light detection section 306 outputs a detection signal corresponding to the amount of the light having been transmitted through the alkali metal atom. As the light detection section 306, a photo diode, for example is used.

The light output variable section 308 applies a voltage between the electrodes 62, 64 of the light source 302 (the light emitting device 100) based on the signal from the light output control section 322 to vary the light output of the light source 302. The light output variable section 308 can also be configured including the second power supply 4 shown in FIG. 1.

The center wavelength variable section 310 applies a voltage between the electrodes 60, 64 of the light source 302 (the light emitting device 100) based on the signal from the center wavelength control section 324 to vary the center wavelength of the light L emitted from the light source 302. Thus, the center wavelength of the resonant light pair (the first light beam and the second light beam) included in the light L can be varied. The center wavelength variable section 310 can also be configured including the first power supply 2 shown in FIG. 1.

The high-frequency wave generation section 312 supplies the light source 302 with a high-frequency signal based on the signal from the high-frequency wave control section 326 to thereby generate the resonant light pair.

The absorption detection section 314 detects the minimum value (bottom of the absorption) of the signal intensity of the detection signal when, for example, changing the center wavelength of the light L.

The EIT detection section 316 performs synchronous detection on the detection signal output by the light detection section 306 to detect the EIT phenomenon.

The light output control section 322 inputs a signal to the light output variable section 308 based on the intensity of the direct-current component (DC component) of the detection signal output by the light detection section 306, and controls the light output of the light source 302. Specifically, the light output control section 322 applies a voltage between the electrodes 62, 64 based on the DC component of the detection signal output by the light detection section 306, and controls the light output of the light source 302. The light output control section 322 can also be configured including an automatic power control (APC) circuit.

The center wavelength control section 324 inputs a signal to the center wavelength variable section 310 based on the signal from the absorption detection section 314, to control the center wavelength of the light L (the center frequency of the resonant light pair). Specifically, the light output control section 322 applies a voltage between the electrodes 60, 64 based on the detection signal output by the light detection section 306, to control the light output of the light L.

The high-frequency wave control section 326 inputs a frequency control signal for sweeping the frequency of the high-frequency signal, and an output control signal for generating or stopping the high-frequency signal to the high-frequency wave generation section 312.

Then an operation of the atomic oscillator 300 will be explained. Firstly, an initial operation when starting up the atomic oscillator 300 in a halt state will be explained.

The light output control section 322 controls the light output variable section 308 based on the DC component of the detection signal output by the light detection section 306, to vary the light output of the light source 302. Specifically, the light output control section 322 varies the light output of the light source 302 so that the DC component of the detection signal becomes a predetermined value.

Then, the light output control section 322 sets the output control signal from the high-frequency wave control section 326 to the ON state, to input the high-frequency signal from the high-frequency wave generation section 312 to the light source 302. On this occasion, the frequency of the high-frequency signal is slightly shifted so that the EIT phenomenon does not occur. For example, in the case of using cesium as the alkali metal atom in the gas cell 304, the frequency of the high-frequency signal is shifted from the value of 4.596 . . . GHz.

Then, the center wavelength control section 324 controls the center wavelength variable section 310 to sweep the center wavelength of the light L. On this occasion, since the frequency of the high-frequency signal is set so that the EIT phenomenon does not occur, the EIT phenomenon does not occur. The absorption detection section 314 detects the minimum value (bottom of the absorption) of the intensity of the detection signal output in the light detection section 306 when sweeping the center wavelength of the light L. The absorption detection section 314 determines the value, at which, for example, the intensity variation of the detection signal with respect to the center wavelength of the light L becomes constant, as the bottom of the absorption.

When the absorption detection section 314 detects the bottom of the absorption, the center wavelength control section 324 controls the center wavelength variable section 310 to fix (lock) the center wavelength. In other words, the center wavelength control section 324 fixes the center wavelength of the light L to the wavelength corresponding to the bottom of the absorption.

Then, the high-frequency wave control section 326 controls the high-frequency wave generation section 312 to tune the frequency of the high-frequency signal to the frequency at which the EIT phenomenon occurs. Subsequently, the transition to a loop operation is made to detect the EIT signal using the EIT detection section 316.

It should be noted that the control of the light output and the control of the center wavelength of the light L can also be performed taking the temperature of the light source 302 into consideration.

Then the loop operation of the atomic oscillator 300 will be explained.

The EIT detection section 316 performs the synchronous detection on the detection signal output by the light detection section 306, and the high-frequency wave control section 326 controls the frequency of the high-frequency signal generated by the high-frequency wave generation section 312 so as to be a frequency corresponding to a half of $\Delta E_{12}$ of the alkali metal atom in the gas cell 304 based on the signal input from the EIT detection section 316.

The absorption detection section 314 performs the synchronous detection on the detection signal output by the light detection section 306, and the center wavelength control section 324 controls the center wavelength variable section 310 so that the center wavelength of the light L becomes the wavelength corresponding to the minimum value (the bottom of the absorption) of the intensity of the detection signal output in the light detection section 306 based on the signal input from the absorption detection section 314.

The light output control section 322 controls the light output variable section 308 based on the DC component of the detection signal output by the light detection section 306. Specifically, in the case in which the DC component of the detection signal becomes smaller than a predetermined value, the light output control section 322 controls the light output variable section 308 so that the DC component of the detection signal becomes the initial value. Even if the center wavelength of the light L is shifted from the wavelength corresponding to the bottom of the absorption due to the control of the light output control section 322, it is possible to tune the center wavelength of the light L to the wavelength corresponding to the bottom of the absorption due to the control of the center wavelength control section 324 described above.

The atomic oscillator 300 has, for example, the following features.

The atomic oscillator 300 can include the light emitting device 100 capable of varying the wavelength by a small variation. Therefore, in the atomic oscillator 300, the center wavelength of the light L emitted from the light emitting device 100 can be controlled with high accuracy.

The atomic oscillator 300 includes the light output control section 322 for applying a voltage between the electrodes 62, 64 of the light emitting device 100 based on the intensity of the detection signal output by the light detection section 306, to control the light output of the light emitting device 100, and the center wavelength control section 324 for applying a voltage between the electrodes 60, 64 of the light emitting device 100 based on the intensity of the detection signal output by the absorption detection section 314, to control the center wavelength of the first light beam and the second light beam (the center frequency of the resonant light pair). Therefore, since in the atomic oscillator 300, the center wavelength can be controlled without injecting a current into the active layer 40 of the light emitting device 100, it is possible to prevent the control from becoming complicated. In the case of, for example, injecting the current into the active layer to control the center wavelength, since the light output also varies in accordance with the injection amount of the current, the control becomes complicated. Further, in the case of not controlling the light output of the light emitting device, the resonant frequency varies in some cases due to the Stark effect.

The embodiments and the modified examples described above are illustrative only, and the invention is not limited to the embodiments and the modified examples. For example, it is also possible to arbitrarily combine the embodiments and the modified examples described above with each other.

The invention includes configurations (e.g., configurations having the same function, the same way, and the same result, or configurations having the same object and the same advantage) substantially the same as any of the configurations described as the embodiments of the invention. Further, the invention includes configurations obtained by replacing a non-essential part of the configuration described as the embodiments of the invention. Further, the invention includes configurations exerting the same functional effects and configurations capable of achieving the same object as any of the configurations described as the embodiments of the invention. Further, the invention includes configurations obtained by adding known technologies to any of the configurations described as the embodiments of the invention.

The entire disclosure of Japanese Patent Application No. 2013-215566 filed Oct. 16, 2013 is expressly incorporated by reference herein.

What is claimed is:

1. A light emitting device comprising:
   a first semiconductor multilayer film mirror of a first conductivity type;
   a second semiconductor multilayer film mirror of a second conductivity type, the second conductivity type being different than the first conductivity type;
   an active layer between the first semiconductor multilayer film mirror and the second semiconductor multilayer film mirror;
   a third semiconductor multilayer film mirror of a semi-insulating type between the first semiconductor multilayer film mirror and the active layer;
   a contact layer of the first conductivity type between the third semiconductor multilayer film mirror and the active layer;
   a first electrode electrically connected to the first semiconductor multilayer film mirror;
   a second electrode electrically connected to the second semiconductor multilayer film mirror; and
   a third electrode having ohmic contact with the contact layer,
   wherein the third semiconductor multilayer film mirror is formed of a material having a bandgap energy higher than an energy of light generated in the active layer.

2. The light emitting device according to claim 1, further comprising:
   a first power supply adapted to apply a voltage between the first electrode and the third electrode, and
   a second power supply adapted to apply a voltage between the second electrode and the third electrode, the second power supply being independent of the first power supply.

3. The light emitting device according to claim 1, further comprising:
   a polarizer adapted to polarize the light generated in the active layer.

4. The light emitting device according to claim 3, wherein
   the active layer and the second semiconductor multilayer film mirror constitute a columnar section,
   the polarization section includes a semiconductor layer configured integrally with the columnar section, and
   the polarizer provides the active layer with a distortion using the semiconductor layer.

5. The light emitting device according to claim 4, wherein
   the polarizer projects from the columnar section in a first direction in a plan view, and
   the first direction coincides with one of a long-axis direction and a short-axis direction of an index ellipsoid of the third semiconductor multilayer film mirror in a state in which a voltage is applied between the first electrode and the third electrode.

6. An atomic oscillator adapted to cause an electromagnetically induced transparency phenomenon in an alkali metal atom using a resonant light pair, comprising:
   a light emitting device adapted to generate the resonant light pair having two frequency components that are different from each other to irradiate the alkali metal atom with the resonant light pair; and
   a light detector adapted to detect an intensity of light transmitted through the alkali metal atom,
   wherein the light emitting device includes:
      a first semiconductor multilayer film mirror of a first conductivity type,
      a second semiconductor multilayer film mirror of a second conductivity type, the second conductivity type being different from the first conductivity type,
      an active layer between the first semiconductor multilayer film mirror and the second semiconductor multilayer film mirror,
      a third semiconductor multilayer film mirror of a semi-insulating type between the first semiconductor multilayer film mirror and the active layer,
      a contact layer of the first conductivity type between the first semiconductor multilayer film mirror and the third semiconductor multilayer film mirror,
      a first electrode electrically connected to the first semiconductor multilayer film mirror,
      a second electrode electrically connected to the second semiconductor multilayer film mirror, and
      a third electrode having ohmic contact with the contact layer, and electrically connected to the third semiconductor multilayer film mirror, and
   wherein the third semiconductor multilayer film mirror is formed of a material having a bandgap energy higher than an energy of light generated in the active layer.

7. The atomic oscillator according to claim 6, further comprising:
   a light output controller adapted to apply a voltage between the second electrode and the third electrode based on an intensity of a detection signal output by the light detector, to control a light output of the light emitting device; and
   a center frequency controller adapted to apply a voltage between the first electrode and the third electrode based on the intensity of the detection signal output by the light detection section, to control a center frequency of the resonant light pair.

8. The atomic oscillator according to claim 6, wherein
   the light emitting device includes a polarizer adapted to polarize the light generated in the active layer.

9. The atomic oscillator according to claim 8, wherein
   the active layer and the second semiconductor multilayer film mirror constitute a columnar section,
   the polarizer includes a semiconductor layer configured integrally with the columnar section, and
   the polarizer provides the active layer with a distortion using the semiconductor layer.

10. The atomic oscillator according to claim 9, wherein
    the polarizer projects from the columnar section in a first direction in a plan view, and
    the first direction coincides with one of a long-axis direction and a short-axis direction of an index ellipsoid of the third semiconductor multilayer film mirror in a state in which a voltage is applied between the first electrode and the third electrode.

* * * * *